US009230856B2

(12) United States Patent
Yeh et al.

(10) Patent No.: US 9,230,856 B2
(45) Date of Patent: Jan. 5, 2016

(54) METHOD FOR MANUFACTURING STRUCTURE HAVING AIR GAP (71) Applicant: Powerchip Technology Corporation, Hsinchu (TW)

(72) Inventors: Ming-Hsin Yeh, Hsinchu (TW); Hsin Tai, Hsinchu (TW); Chan-Tsun Wu, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/316,816

(22) Filed: Jun. 27, 2014

(65) Prior Publication Data
US 2015/0270336 A1    Sep. 24, 2015

(30) Foreign Application Priority Data
Mar. 21, 2014    (TW) .............................. 103110712 A (51) Int. Cl.
| H01L 29/06 | (2006.01) |
| H01L 29/66 | (2006.01) |
| H01L 21/308 | (2006.01) |
| H01L 21/306 | (2006.01) |
| H01L 21/02 | (2006.01) |
| H01L 27/115 | (2006.01) |
| H01L 21/768 | (2006.01) |
| H01L 23/522 | (2006.01) |

(52) U.S. Cl.
CPC ...... *H01L 21/7682* (2013.01); *H01L 21/02112* (2013.01); *H01L 21/02129* (2013.01); *H01L 21/02164* (2013.01); *H01L 21/02266* (2013.01); *H01L 21/02271* (2013.01); *H01L 21/306* (2013.01); *H01L 21/3081* (2013.01); *H01L 23/5222* (2013.01)

(58) Field of Classification Search
CPC .................. H01L 29/0649; H01L 21/02164; H01L 29/66825; H01L 27/11521; H01L 21/3081; H01L 21/02112; H01L 21/02266; H01L 21/02129; H01L 21/02271; H01L 21/306; H01L 2924/0002; H01L 2924/00; H01L 21/7682; H01L 21/76826; H01L 21/76832; H01L 23/5329; H01L 21/76885; H01L 21/02126; H01L 21/02274; H01L 21/764; H01L 21/76834; H01L 21/02107; H01L 21/02131; H01L 21/02697; H01L 21/31058; H01L 21/31111; H01L 21/31116; H01L 21/31144; H01L 21/32115; H01L 21/7684; H01L 21/76897; H01L 21/02282; H01L 21/30604; H01L 21/76829; H01L 21/822; H03H 9/173
USPC .......................................................... 438/422
See application file for complete search history.

(56) References Cited

U.S. PATENT DOCUMENTS

| 7,772,706 | B2 | 8/2010 | Balakrishnan et al. |
| 2013/0056817 | A1* | 3/2013 | Kim et al. ..................... 257/321 |
| 2013/0183818 | A1 | 7/2013 | Na et al. |
| 2014/0138790 | A1* | 5/2014 | Sugino et al. ................. 257/522 |

* cited by examiner

*Primary Examiner* — Caleen Sullivan
(74) *Attorney, Agent, or Firm* — Jianq Chyun IP Office (57) ABSTRACT

A method for manufacturing a structure having an air gap includes following steps. A plurality of patterns is formed in a pattern region of a substrate. A sacrificial layer is formed on the substrate, and a top surface of the sacrificial layer is lower than a top surface of the patterns to expose a plurality of upper portions of the patterns. A hard mask layer is formed to cover the sacrificial layer and the upper portions of the patterns. An etching-back process is performed to the hard mask layer to expose the sacrificial layer outside the pattern region, and the hard mask layer remaining inside the pattern region seals the opening between the upper portions of the patterns. The sacrificial layer is removed to form an air gap between the two adjacent patterns.

17 Claims, 7 Drawing Sheets

METHOD FOR MANUFACTURING STRUCTURE HAVING AIR GAP

CROSS-REFERENCE TO RELATED APPLICATION

This application claims the priority benefit of Taiwan application serial no. 103110712, filed on Mar. 21, 2014. The entirety of the above-mentioned patent application is hereby incorporated by reference herein and made a part of this specification.

BACKGROUND OF THE INVENTION

1. Field of the Invention

The invention relates to a method for manufacturing a semiconductor device, and particularly relates to a method for manufacturing a structure having an air gap.

2. Description of Related Art

Currently, a structure having an air gap in semiconductor devices is developed to prevent electrical interference among the components.

Below, a non-volatile memory device is used as an example for description. In general, the conventional non-volatile memory device is formed of a stacked gate structure including a floating gate and a control gate formed of doped polysilicon. The floating gate is located between the control gate and the substrate and is in a floating state, while the control gate is connected with a word line. In addition, the non-volatile memory device further includes a tunneling dielectric layer and an inter-gate dielectric layer, which are respectively located between the substrate and the floating gate and between the floating gate and the control gate.

Due to the tendency of improving the integration of the devices, the size of the devices is reduced based on a design rule. Under such a circumstance, in order to prevent the increase of a resistor-capacitor (RC) delay and increase of a coupling interference between the floating gates to increase a gate coupling rate, an air gap is formed within the stacked gate structure to solve these issues.

However, as the integration of the device increases, the non-volatile memory device manufactured with the conventional method for manufacturing the non-volatile memory may have a lower air-gap ratio, and are thus unable to effectively reduce the RC delay and solve the issue of coupling interference between the floating gates.

SUMMARY OF THE INVENTION

The invention provides a method for forming a structure having an air gap capable of increasing an air-gap ratio.

The invention provides a method for forming a structure having an air gap, including steps as follows. A plurality of patterns is formed in a pattern region of a substrate. A sacrificial layer is formed on the substrate, wherein an upper surface of the sacrificial layer is lower than an upper surface of the patterns, and a plurality of upper portions of the patterns are exposed. A hard mask layer covering the sacrificial layer and the upper portions of the patterns is formed. An etching-back process is performed to the hard mask layer to expose the sacrificial layer outside the pattern region, wherein the hard mask layer remaining in the pattern region seals an opening between the upper portions of the patterns. The sacrificial layer is removed and an air gap is formed between two adjacent of the patterns.

According to an embodiment of the invention, in the method for forming the structure having the air gap, the patterns include single layer patterns or multi-layer stacked patterns.

According to an embodiment of the invention, in the method for forming the structure having the air gap, a material of the patterns includes a metallic or a doped semiconductor material.

According to an embodiment of the invention, in the method for forming the structure having the air gap, a process of forming the sacrificial layer includes steps as follows. A sacrifice material layer covering the patterns is formed on the substrate. A portion of the sacrifice material layer is removed.

According to an embodiment of the invention, in the method for forming the structure having the air gap, a material of the sacrifice material layer is an organic material, an inorganic material, or an organic-inorganic hybrid material, for example.

According to an embodiment of the invention, in the method for forming the structure having the air gap, a process of forming the sacrifice material layer is a coating process, a chemical vapor deposition process, or a physical vapor deposition process, for example.

According to an embodiment of the invention, in the method for forming the structure having the air gap, a process of removing the sacrifice material layer includes an etching-back process, for example.

According to an embodiment of the invention, in the method for forming the structure having the air gap, a distance between the upper surface of the sacrificial layer and the upper surface of the patterns is no less than ½ of a distance between the patterns, for example.

According to an embodiment of the invention, in the method for forming the structure having the air gap, a material of the hard mask layer is silicon oxide, silicon nitride, silicon oxynitride, or a carbon-containing silicon-based dielectric material, for example.

According to an embodiment of the invention, in the method for forming the structure having the air gap, a process of forming the hard mask layer is a chemical vapor deposition process, for example.

According to an embodiment of the invention, in the method for forming the structure having the air gap, the hard mask layer is conformally formed, for example.

According to an embodiment of the invention, in the method for forming the structure having the air gap, a thickness of the hard mask layer is no less than ½ of a distance between the patterns, for example.

According to an embodiment of the invention, the method for forming the structure having the air gap further includes performing the etching-back process to the hard mask layer to form a spacer at a periphery of the patterns.

According to an embodiment of the invention, in the method for forming the structure having the air gap, a process of removing the sacrificial layer is a wet etch removing process or a dry etch removing process, for example.

According to an embodiment of the invention, in the method for forming the structure having the air gap, a dielectric layer covering the hard mask layer and the patterns is formed after the air gap is formed.

According to an embodiment of the invention, in the method for forming the structure having the air gap, a material of the dielectric layer is silicon oxide, boron phosphate silicate glass, or a carbon-containing material containing, for example.

According to an embodiment of the invention, in the method for forming the structure having the air gap, a process of forming the dielectric layer is a chemical vapor deposition process or a coating process, for example.

Based on the embodiment above, it can be known that in the method of forming the structure having the air gap provided in the invention, the etching-back process may be performed to the hard mask layer to expose the sacrificial layer outside the pattern region. In addition, the hard mask layer in the pattern region seals the opening between the upper portions of the patterns. Then, the air gap is formed by removing the sacrificial layer. Thus, a simple manufacturing process may be used to form the structure having a high air-gap ratio. In addition, the method for forming the structure having the air gap provided in the invention may control a depth of the opening between the upper portions of the patterns to control a depth to which the hard mask layer fills the opening, thereby controlling the air-gap ratio. Furthermore, the method for forming the structure having the air gap provided in the invention may use the hard mask layer in the patter region to support a shape of the patterns to prevent the patterns from being bent or collapsing.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1G are top views illustrating processes for manufacturing a structure having an air gap according to an embodiment of the invention. FIGS. 2A to 2G are cross-sectional views taken along a cross-sectional line I-I' in FIGS. 1A to 1G. FIGS. 3A to 3G are cross-sectional views taken along a cross-sectional line II-II' in FIGS. 1A to 1G.

In this embodiment, a structure having an air gap may be a variety of structures used in semiconductor devices, such as a stacking structure of a non-volatile memory or an array structure of a word line.

Figure 1A:
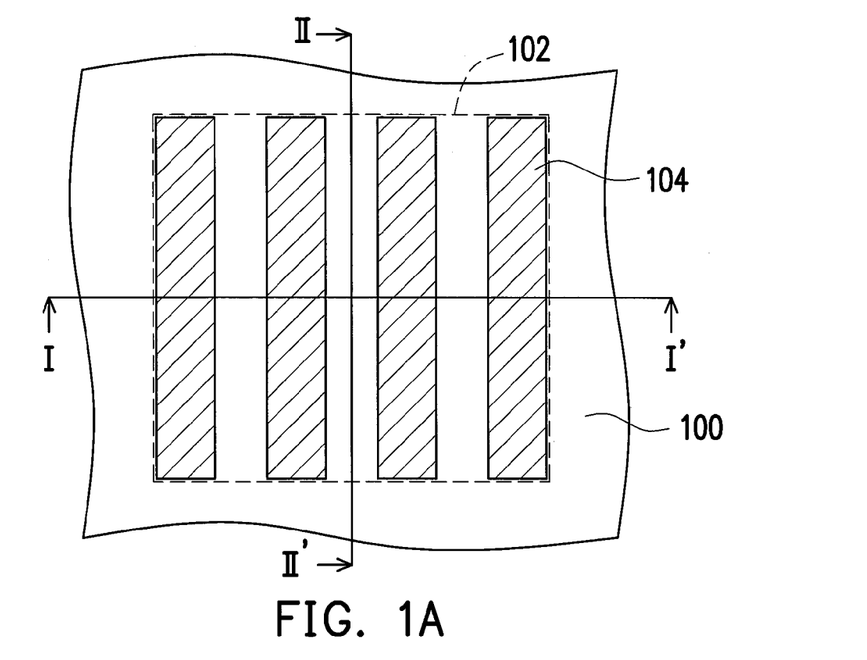
FIGS. 1A to 1G are top views illustrating processes for manufacturing a structure having an air gap according to an embodiment of the invention.
Figure 2A:
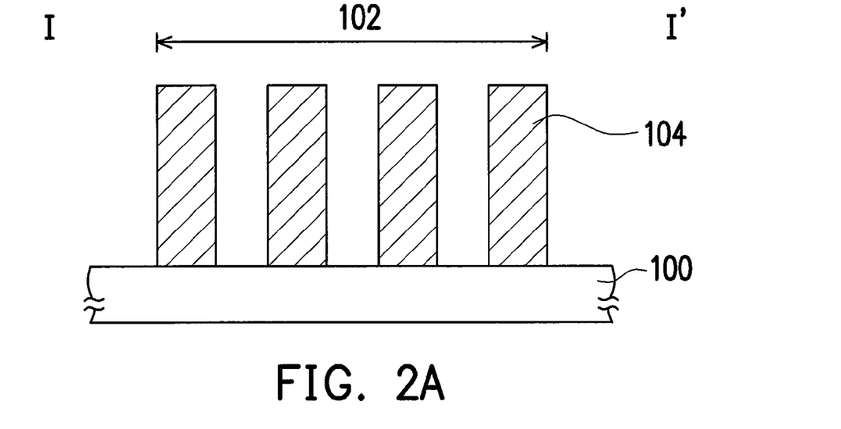
FIGS. 2A to 2G are cross-sectional views taken along a cross-sectional line I-I' in FIGS. 1A to 1G.
Figure 3A:
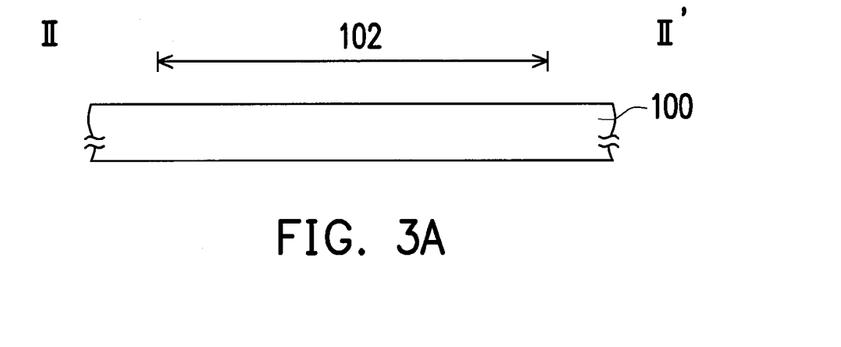
FIGS. 3A to 3G are cross-sectional views taken along a cross-sectional line II-II' in FIGS. 1A to 1G.

First of all, referring to FIGS. 1A, 2A, and 3A simultaneously, a plurality of patterns 104 is formed in a pattern region 102 of a substrate 100. The substrate 100 is, for example, a silicon substrate. The patterns 104 may be single-layer patterns 104 or multi-layer stacked patterns 104, such as word-line patterns or stacked gate patterns. A material of the patterns 104 includes a metallic or a doped semiconductor material. A process of forming the patterns 104 is, for example, to form a pattern material layer (not shown) on the substrate 100, and then pattern the pattern material layer to form the patterns 104. However, the process of forming the patterns 104 of the invention is not limited thereto.

Figure 1B:
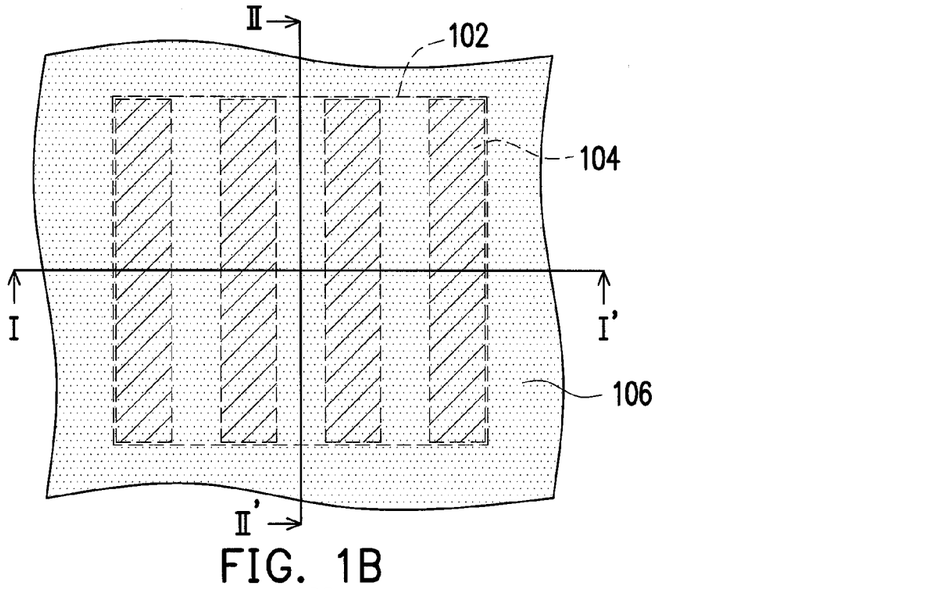
Figure 2B:
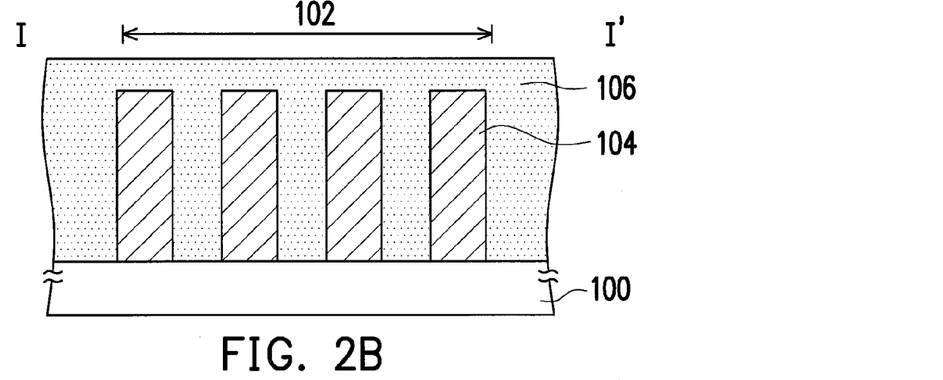
Figure 3B:
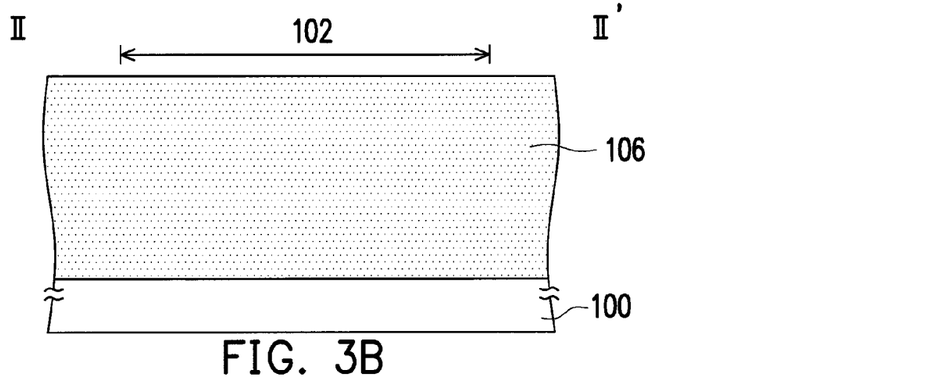

Then, referring to FIGS. 1B, 2B, and 3B simultaneously, a sacrificial material layer 106 covering the patterns 104 is formed on the substrate 100. A material of the sacrificial material layer 106 is an organic material, an inorganic material, or an organic-inorganic hybrid material, for example. The organic material is a photo-resist material or an under-layer material without having to be developed, for example. The inorganic material is a bottom anti-reflection coating (BARC) material, a carbon-containing material, or an amorphous carbon material, for example. The method for forming the sacrifice material layer 106 includes coating, chemical vapor deposition, or physical vapor deposition, for example.

Figure 1C:
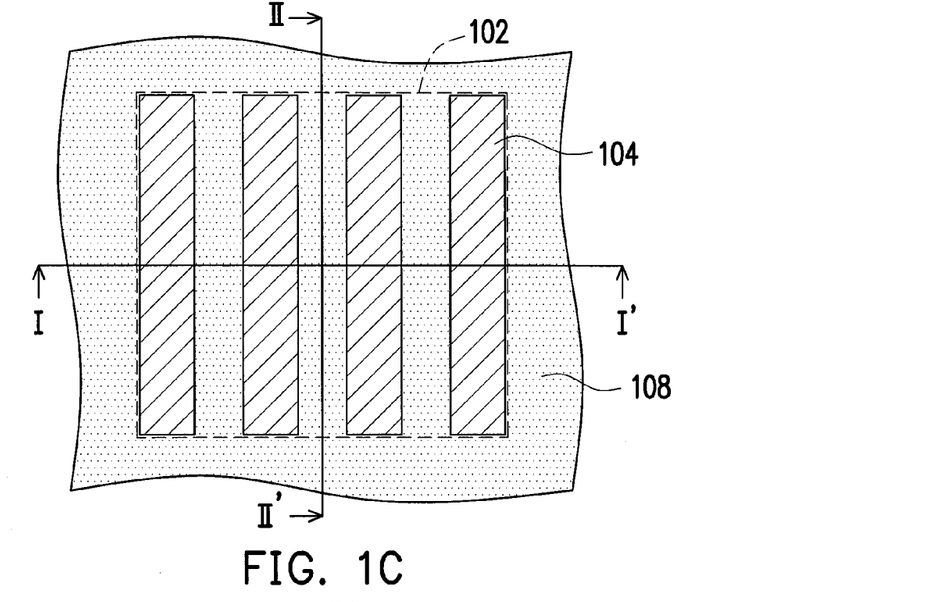
Figure 2C:
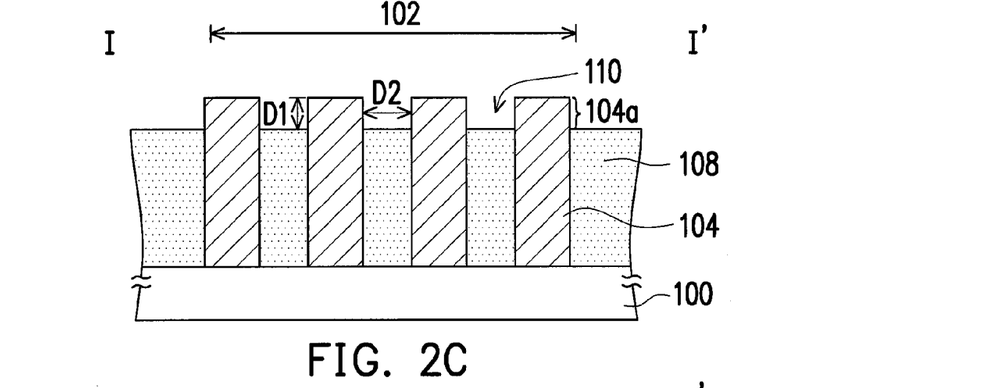
Figure 3C:
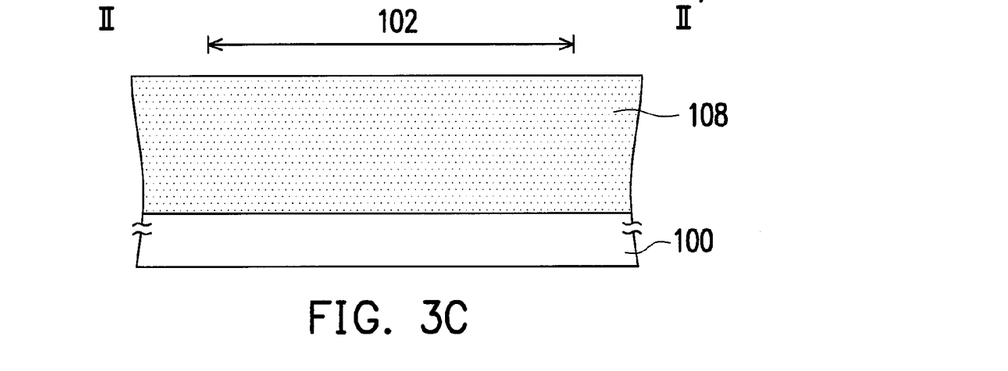

Then, referring to FIGS. 1C, 2C, and 3C simultaneously, a portion of the sacrifice material layer 106 is removed to form a sacrificial layer 108 on the substrate 100. In addition, an upper surface of the sacrificial layer 108 is lower than an upper surface of the patterns 104, so as to expose a plurality of upper portions 104a of the patterns 104. Here, an opening 110 is formed between the upper portions 104a of two adjacent of the patterns 104. A process of removing the portion of the sacrifice material layer 106 is an etching-back process, for example. A distance D1 between the upper surface of the sacrificial layer 108 and the upper surface of the patterns 104 is no less than ½ of a distance D2 between the patterns 104, for example. In addition, the distance D2 between the patterns 104 may be considered as a feature size. In this embodiment, although the sacrificial layer 108 is formed as described above, formation of the sacrificial layer 108 of the invention is not limited thereto.

Figure 1D:
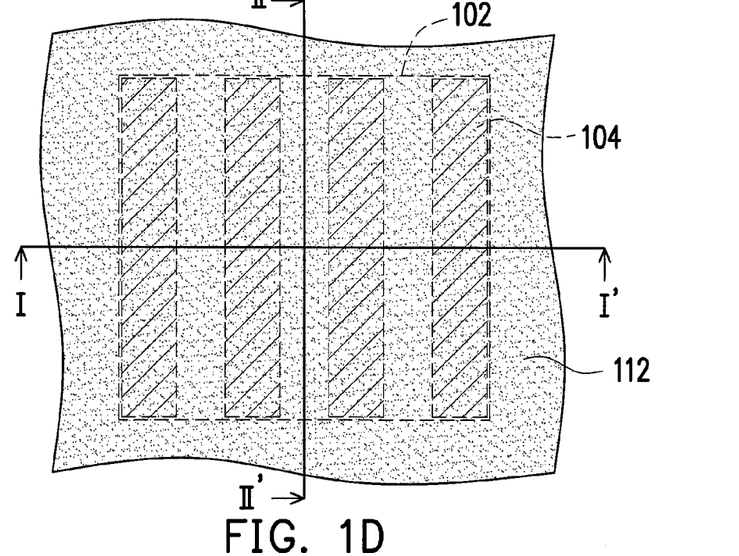
Figure 2D:
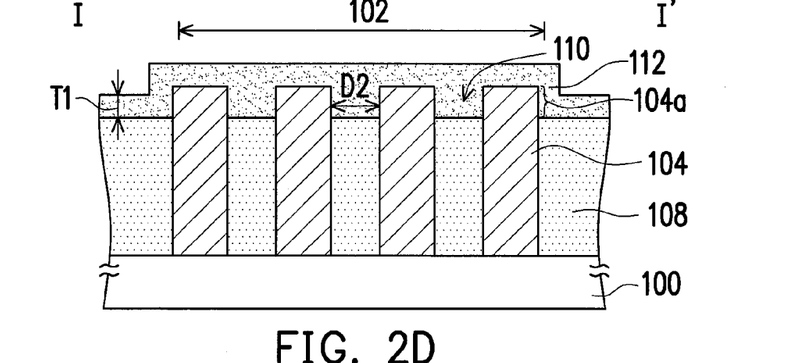
Figure 3D:
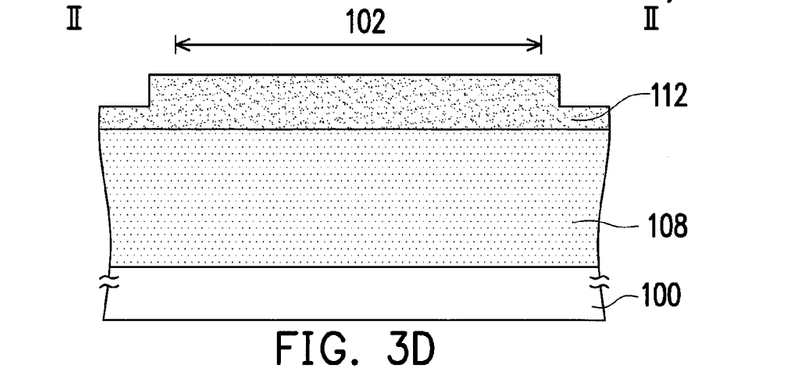

Then, referring to FIGS. 1D, 2D, and 3D simultaneously, a hard mask layer 112 covering the sacrificial layer 108 and the upper portions 104a of the patterns 104 is formed. Here, the hard mask layer 112 fills the opening 110, for example. In addition, an upper surface of the hard mask layer 112 in the pattern region 102 is higher than the upper surface of the patterns 104, for example. However, the invention is not limited thereto. Materials of the hard mask layer 112 and the sacrificial layer 108 are materials having a high etching selectivity ratio, for example. The material of the hard mask layer 112 is silicon oxide, silicon nitride, silicon oxynitride, or a carbon-containing silicon-based dielectric material, for example. A process of forming the hard mask layer 112 is a chemical vapor deposition process, an atomic layer deposition (ALD) process, or a molecular layer deposition (MLD) process, for example. In addition, when the material of the sacrificial layer 108 is a photo-resist material, a low-temperature atomic layer deposition or molecular layer deposition process may be chosen to form the sacrificial layer 108, so as not to damage the sacrificial layer 108. In this embodiment, the hard mask layer 112 is formed conformally, for example. In addition, a thickness T1 of the hard mask layer 112 is no less than ½ of the distance D2 between the patterns 104, for example, such that the conformal hard mask layer 112 may seal the opening 110 between the upper portions 104a of the patterns 104. However, the process of forming the hard mask layer 112 of the invention is not limited thereto.

Figure 1E:
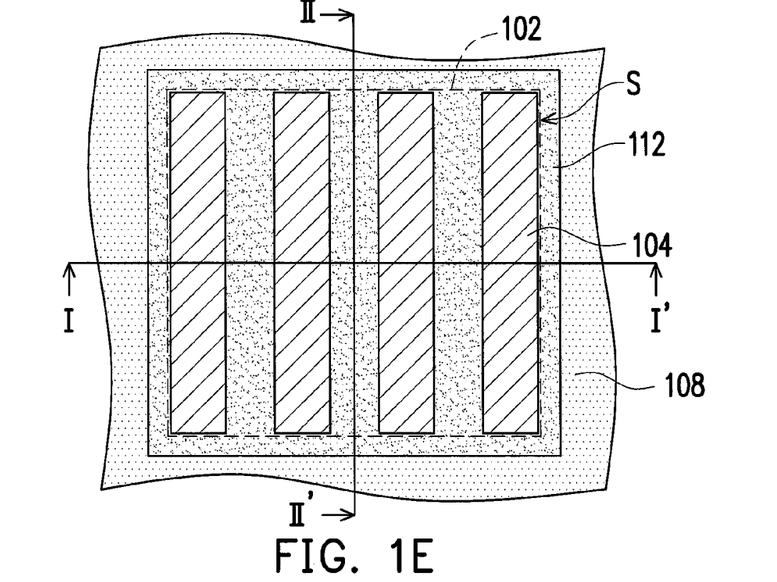
Figure 2E:
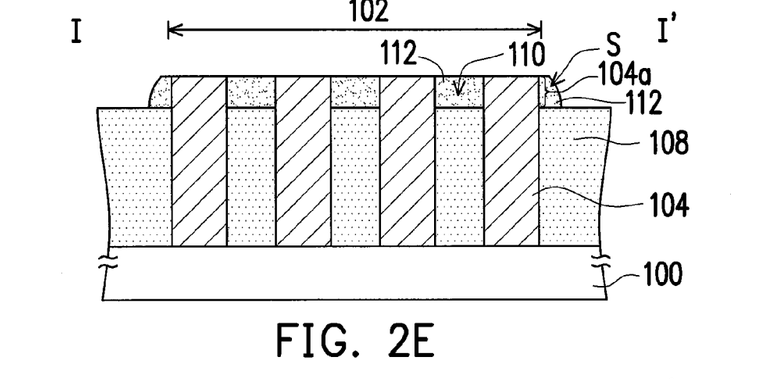
Figure 3E:
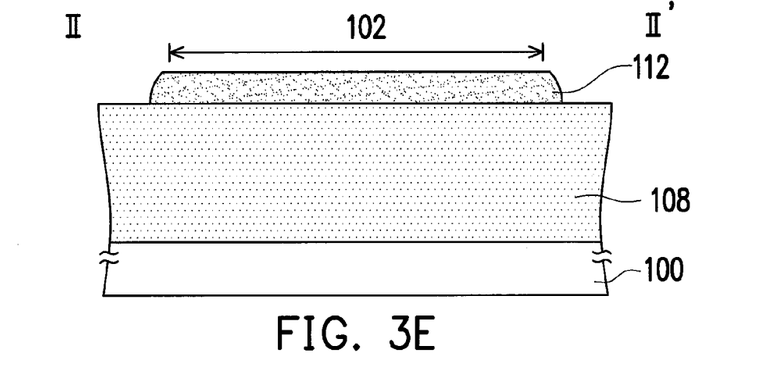

Then, referring to FIGS. 1E, 2E, and 3E simultaneously, an etching-back process is performed to the hard mask layer 112 to expose the sacrificial layer 108 outside the pattern region 102. In addition, the hard mask layer 112 remaining in the pattern region seals the opening 110 between the upper portions 104a of the patterns 104. During the etching-back process performed to the hard mask layer 112, the hard mask layer 112 may be formed with a spacer S at the periphery of the patterns 104. Besides, the hard mask layer 112, after the etching-back process is performed, may expose the upper surface of the patterns 104. However, the invention is not limited thereto.

Figure 1F:
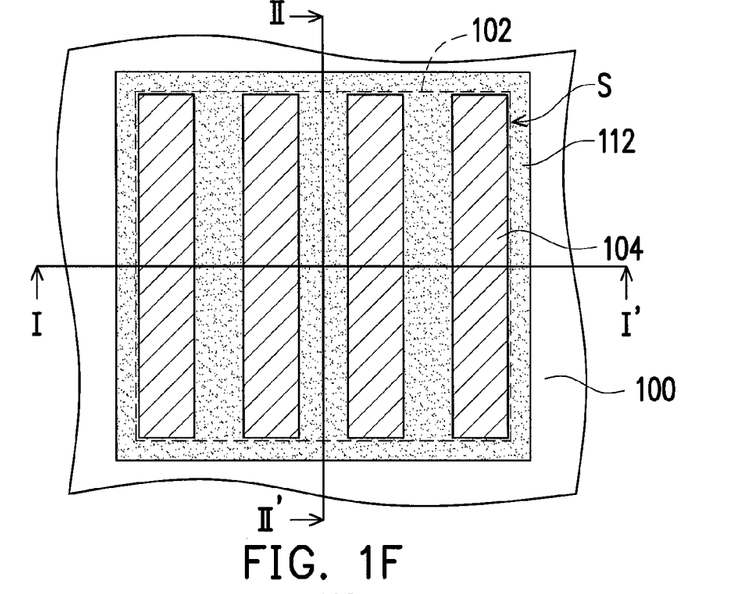
Figure 2F:
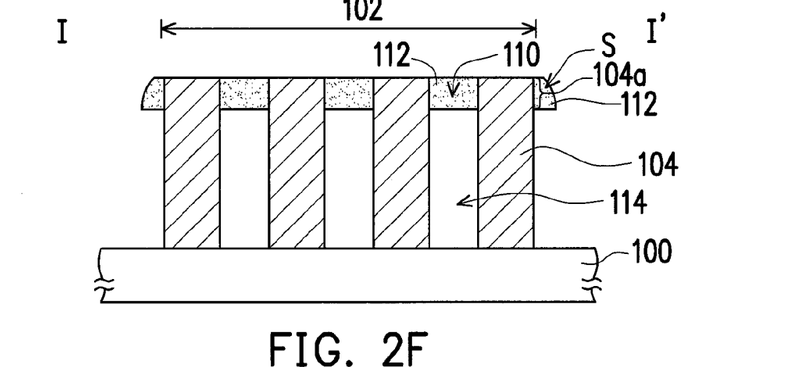
Figure 3F:
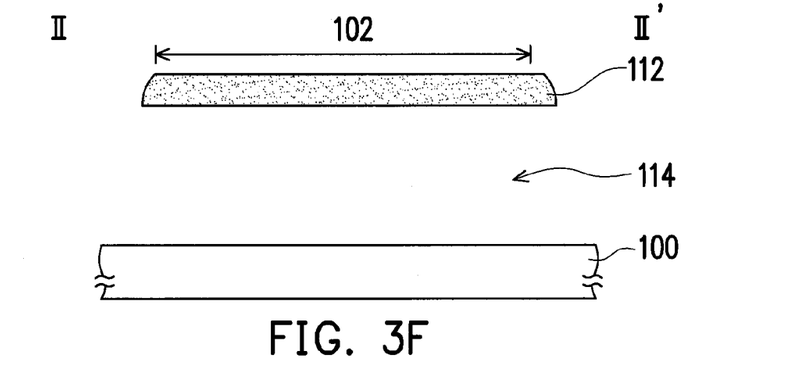

Then, referring to FIGS. 1F, 2F, and 3F, the sacrificial layer 108 is removed to form an air gap 114 between the adjacent patterns 104 A process of removing the sacrificial layer 108 is a wet etch removing process or a dry etch removing process, for example. The wet etch removing process is a chemical or solvent photo-resist stripping process or a wet etching process, for example. The dry etch removing process is a plasma photo-resist stripping process or a plasma etching process, for example. Since the materials of the sacrificial layer 108 and the hard mask layer 112 may have a high etching selectivity ratio (e.g. 1:1000), the sacrificial layer 108 may be easily removed. In addition, after removal of the sacrificial layer 108, the hard mask layer 112 may still seal the opening 110 between the upper portions 104a of the patterns 104.

Figure 1G:
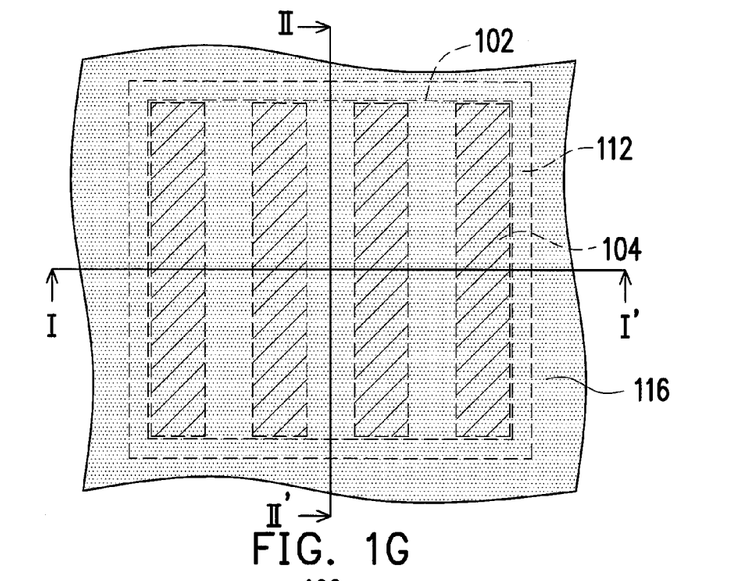
Figure 2G:
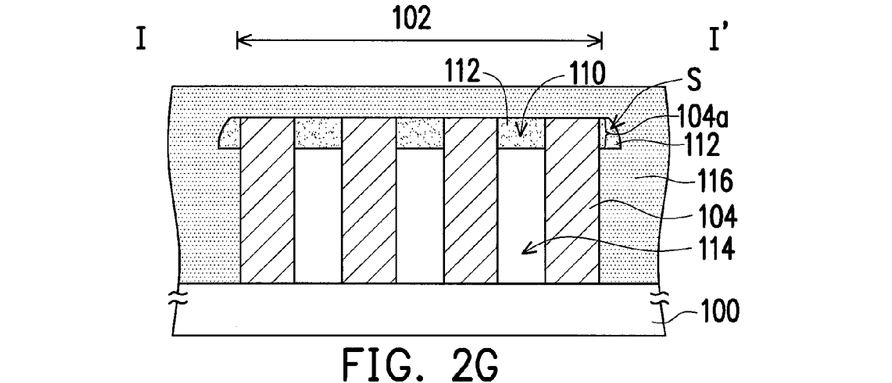
Figure 3G:
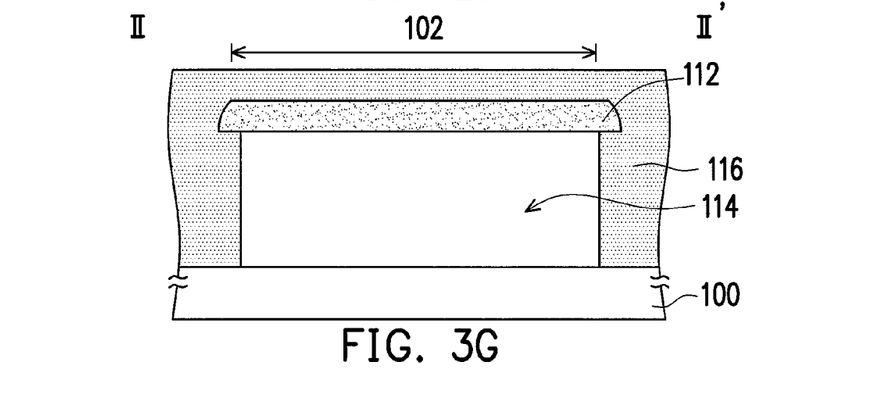

Then, a dielectric layer 116 covering the hard mask layer 112 and the patterns 104 may be selectively formed based on the requirement of the manufacturing process. A material of the dielectric layer 116 may be silicon oxide, boron phosphate silicate glass, or a carbon-containing material. The process of forming the dielectric layer 116 is a chemical vapor deposition process or a coating process, for example. In addition, in the process of forming the dielectric layer 116, the dielectric layer 116 may be prevented from entering the air gap 114 through control of the manufacturing condition.

Based on the embodiment above, it can be known that in the method of forming the structure having the air gap 114 provided in the embodiments, the etching-back process may be performed to the hard mask layer 112 to expose the sacrificial layer 108 outside the pattern region 102. In addition, the hard mask layer 112 remaining in the pattern region 102 seals the opening 110 between the upper portions 104a of the patterns 104. Then, the air gap 114 is formed by removing the sacrificial layer 108. Thus, a simple manufacturing process may be used to form the structure having a high air-gap ratio. In addition, the method provided in the embodiments may control a depth of the opening 110 between the upper portions 104a of the patterns 104 to control a depth to which the hard mask layer 112 fills the opening 110, thereby controlling the air-gap ratio. Moreover, in the method provided in the embodiments, the hard mask layer 112 in the pattern region 102 may be used to support a shape of the patterns 104, so as to prevent the patterns 104 from being bent or collapsing.

In addition, since the method for forming the structure having the air gap 114 described in the embodiments have the characteristics described above, a semiconductor device may have a preferable electrical performance, such as preventing a resistor-capacitor delay or improving a gate coupling rate, when the method is applied in manufacture of the semiconductor device.

In view of the foregoing, the method for forming the structure having the air gap provided in the embodiments of the invention at least has the following characteristics. The method for forming the structure having the air gap provided in the embodiments allows the structure having a high air-gap ratio to be formed through a simple manufacture process. In addition, the air-gap ratio is controllable when the structure having an air gap is formed by the method provided in the embodiments. Furthermore, the patterns are prevented from being bent or collapsing when the structure having an air gap is formed by the method provided in the embodiments.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a structure having an air gap, comprising:
    forming a plurality of patterns in a pattern region of a substrate;
    forming a sacrificial layer on the substrate, wherein an upper surface of the sacrificial layer is lower than an upper surface of the plurality of patterns, and a plurality of upper portions of the plurality of patterns is exposed;
    forming a hard mask layer covering the sacrificial layer and the plurality of upper portions of the plurality of patterns;
    performing an etching-back process to the hard mask layer to expose the sacrificial layer outside the pattern region, wherein the hard mask layer remaining in the pattern region seals an opening at the plurality of upper portions of the plurality of patterns; and
    removing the sacrificial layer, and forming an air gap between two adjacent patterns of the plurality of patterns.

2. The method for forming the structure having the air gap as claimed in claim 1, wherein the plurality of patterns comprises single layer patterns or multi-layer stacked patterns.

3. The method for forming the structure having the air gap as claimed in claim 1, wherein a material of the plurality of patterns comprises a metallic or a doped semiconductor material.

4. The method for forming the structure having the air gap as claimed in claim 1, wherein forming the sacrificial layer comprises:
    forming a sacrifice material layer covering the plurality of patterns on the substrate; and
    removing a portion of the sacrifice material layer.

5. The method for forming the structure having the air gap as claimed in claim 4, wherein a material of the sacrifice material layer is an organic material, an inorganic material, or an organic-inorganic hybrid material.

6. The method for forming the structure having the air gap as claimed in claim 4, wherein a process of forming the sacrifice material layer comprises a coating process, a chemical vapor deposition process, or a physical vapor deposition process.

7. The method for forming the structure having the air gap as claimed in claim 4, wherein a process of removing the sacrifice material layer comprises an etching-back process.

8. The method for forming the structure having the air gap as claimed in claim 1, wherein a distance between the upper surface of the sacrificial layer and the upper surface of the plurality of patterns is no less than ½ of a distance between two adjacent patterns of the plurality of patterns.

9. The method for forming the structure having the air gap as claimed in claim 1, wherein a material of the hard mask layer comprises silicon oxide, silicon nitride, silicon oxynitride, or a carbon-containing silicon-based dielectric material.

10. The method for forming the structure having the air gap as claimed in claim 1, wherein a process of forming the hard mask layer comprises a chemical vapor deposition process.

11. The method for forming the structure having the air gap as claimed in claim 1, wherein the hard mask layer is conformally formed.

12. The method for forming the structure having the air gap as claimed in claim 11, wherein a thickness of the hard mask layer is no less than ½ of a distance between two adjacent patterns of the plurality of patterns.

13. The method for forming the structure having the air gap as claimed in claim 1, wherein performing the etching-back process to the hard mask layer further comprises forming a spacer at a periphery of the plurality of patterns.

14. The method for forming the structure having the air gap as claimed in claim 1, wherein a process of removing the sacrificial layer comprises a wet etch removing process or a dry etch removing process.

15. The method for forming the structure having the air gap as claimed in claim 1, further comprising forming a dielectric layer covering the hard mask layer and the plurality of patterns after the air gap is formed.

16. The method for forming the structure having the air gap as claimed in claim 15, wherein a material of the dielectric layer comprises silicon oxide, boron phosphate silicate glass, or a carbon-containing material.

17. The method for forming the structure having the air gap as claimed in claim 15, wherein a process of forming the dielectric layer comprises a chemical vapor deposition process or a coating process.

* * * * *